(12) United States Patent
Vanhoucke et al.

(10) Patent No.: US 8,704,335 B2
(45) Date of Patent: Apr. 22, 2014

(54) SPACER FORMATION IN THE FABRICATION OF PLANAR BIPOLAR TRANSISTORS

(75) Inventors: Tony Vanhoucke, Bierbeek (BE); Johannes Josephus Theodorus Marinus Donkers, Valkenswaard (NL); Hans Mertens, Leuven (NL); Philippe Meunier-Beillard, Kortenberg (BE)

(73) Assignee: NXP, B.V., Eindhoven (NL)

(*) Notice: Subject to any disclaimer, the term of this patent is extended or adjusted under 35 U.S.C. 154(b) by 0 days.

(21) Appl. No.: 13/076,290

(22) Filed: Mar. 30, 2011

(65) Prior Publication Data

US 2012/0168908 A1 Jul. 5, 2012

(30) Foreign Application Priority Data

Apr. 1, 2010 (EP) ..................... 10250714

(51) Int. Cl.
*H01L 29/66* (2006.01)
*H01L 29/06* (2006.01)
*H01L 21/331* (2006.01)
*H01L 21/00* (2006.01)

(52) U.S. Cl.
USPC .............. 257/565; 257/19; 438/312; 438/505

(58) Field of Classification Search
USPC ............................. 257/19, 565; 438/312, 505
See application file for complete search history.

(56) References Cited

U.S. PATENT DOCUMENTS

| | | | | |
|---|---|---|---|---|
| 5,227,316 A * | 7/1993 | Vora et al. | ..................... | 438/655 |
| 5,235,206 A | 8/1993 | Desilets | | |
| 5,557,118 A * | 9/1996 | Hashimoto | ..................... | 257/197 |
| 5,866,462 A * | 2/1999 | Tsai et al. | ..................... | 438/366 |
| 6,156,595 A | 12/2000 | Sawada | | |
| 6,239,477 B1 * | 5/2001 | Johnson | ..................... | 257/592 |
| 7,687,887 B1 | 3/2010 | El-Diwany | | |
| 2005/0079678 A1 | 4/2005 | Verma et al. | | |
| 2009/0206370 A1 * | 8/2009 | Chu et al. | ..................... | 257/197 |
| 2010/0289022 A1 * | 11/2010 | Melai et al. | ..................... | 257/51 |

FOREIGN PATENT DOCUMENTS

| | | |
|---|---|---|
| EP | 0 418 185 A1 | 3/1991 |
| EP | 1 134 797 A1 | 9/2001 |
| WO | 03/100845 A1 | 12/2003 |

OTHER PUBLICATIONS

Knoll, D. et al., "A Flexible, Low-Cost, High Performance SiGe:C BiCMOS Process with a One-Mask HBT Module", IEEE IEDM, pp. 783-786 (2002).

Knoll, D. et al., "A Modular, Low-Cost SiGe:C BiCMOS Process Featuring High-$f_T$ and High-$BV_{CEO}$ transistors", IEEE BCTM 12.5, pp. 241-244, (2004).

(Continued)

*Primary Examiner* — Long K Tran
*Assistant Examiner* — Dzung Tran

(57) ABSTRACT

A bipolar transistor is fabricated having a collector (52) in a substrate (1) and a base (57, 58) and an emitter (59) formed over the substrate. The base has a stack region (57) which is laterally separated from the emitter (59) by an electrically insulating spacer (71). The insulating spacer (71) has a width dimension at its top end at least as large as the width dimension at its bottom end and forms a Γ-shape or an oblique shape. The profile reduces the risk of silicide bridging at the top of the spacer in subsequent processing, while maintaining the width of emitter window.

18 Claims, 14 Drawing Sheets

(56) References Cited

OTHER PUBLICATIONS

Augendre, E. et al., "Thin L-shaped Spacers for CMOS Devices", IEEE, pp. 219-222 (2003).

Vanhoucke, T. et al., "Simultaneous Extraction of the Base and Thermal Resistance of Bipolar Transistors", IEEE Transactions Electron Devices, vol. 52, No. 8, pp. 1887-1892, (Aug. 2005).

Noort van, W. D. et al., "BiCMOS Technology Improvements for Microwave Application", IEEE BCTM 6.2, pp. 93-96 (2008).

Extended European Search Report for Patent Appln. No. 10250714.2 (Aug. 17, 2010).

Chinese Office Action dated Feb. 5, 2013.

* cited by examiner

OLD SPACER

NEW LEUVEN SPACER

SPACER FORMATION IN THE FABRICATION OF PLANAR BIPOLAR TRANSISTORS

CROSS-REFERENCE TO RELATED APPLICATIONS

This application claims the priority under 35 U.S.C. §119 of European patent application no. 10250714.2, filed on Apr. 1, 2010, the contents of which are incorporated by reference herein.

The present invention relates to planar bipolar transistors and in particular, though not exclusively, to the fabrication of heterojunction bipolar transistors such as those using a low-complexity SiGe:C architecture.

A schematic diagram of a conventional planar low-complexity heterojunction bipolar transistor (HBT) is shown in FIG. 1. A semiconductor substrate 1 serves as a collector region 2 surrounded by a shallow trench isolation (STI) region 3. A polysilicon gate 4 provides an electrical connection to a base epitaxial layer 6 via a polysilicon base stack 7. The base stack 7 is the vertical portion of the base semiconductor region. The polysilicon gate layer 4 is separated from the STI region and substrate 1 by a gate oxide layer 5. An emitter 8 is in contact with the base at an emitter window 9 having an emitter window width $W_E$. The emitter 8 is otherwise electrically isolated from the base epitaxial layer 6 and the polysilicon base stack 7 by spacers 10, formed in a suitable electrically insulating material such as silicon oxide. The emitter 8 has an electrical contact 11 formed on its surface. Electrical contacts for the base and collector are not shown on this schematic diagram but can be made to the polysilicon gate 4 and to the collector region 2 via the substrate 1 beyond the shallow trench isolation regions 3.

The spacers 10 have a number of important design constraints. The spacer width $d_2$ at the top of the spacer 10 must not be too small or it will be bridged when a silicide layer is subsequently formed on the top surfaces of the polysilicon base stack 7 and the emitter 8. The formation of silicide on these surfaces is required to create good electrical contacts to the emitter and base. However, increasing the width $d_2$ of the spacer 10 at the top results in an increase in the width $d_5$ of the spacer 10 at the bottom which in turn leads to a reduction in the emitter window size $W_E$, an increase in the base link resistance (i.e. a longer base current path beneath the spacer 10) and a higher extrinsic base-collector capacitance, i.e. a larger B-C junction that does not contribute to the device operation. These parameters are illustrated in FIG. 2 where it can be seen that the width $d_5$ of the bottom of the spacer 10 leads to a high base-collector capacitance $C_{BC}$ and a high base link resistance $R_{B\ link}$. Reducing the width of the spacer 10a yields a lower $C_{BC}$ and $R_{B,link}$ but at the expense of a narrower width $d_2$ at the top of the spacer 10a. This can lead to bridging of the spacer during the subsequent silicidation process with consequent shorting of the emitter and base.

In some process technologies, to minimise the overall width of spacers 10 as much as possible, the spacers can be formed in an "L" shape. This is shown schematically in FIGS. 3A and 3B where the structure of the transistor is shown using L-shaped spacers 20. The relationship of L-spacer distance to $R_{link}$ is shown in FIG. 3C. FIGS. 3D and 3E depict examples of L-shaped spacers of a 150 nm and 48 nm dimension, respectively. These L-shaped spacers 20 can be formed using a process as shown with reference to FIGS. 4A-4D. As shown in FIG. 4A, a polysilicon base stack 7 has a first thin oxide layer 41, thin nitride layer 42 and second thin oxide layer 43 formed thereon. A polysilicon spacer layer 44 is deposited over that. An anisotropic etch of the polysilicon layer 44 creates a polysilicon spacer 45 as shown in FIG. 4B, consuming a bit of the second oxide layer 43 underneath. Following a very short HF-based wet oxide removal (FIG. 4c), (FIG. 4C), the nitride layer 42 is etched using the first oxide layer 41 as a hard mask. During the etching of the exposed nitride layer 42, the polysilicon spacer 45 is also consumed leaving a thin L-shaped spacer 20 which will subsequently serve to separate the base 7 and the emitter 8 except in the emitter window 9. The potential problem of silicide bridging still remains with this architecture and is illustrated in the scanning electron micrograph (SEM) of FIG. 5 (within the highlighted squares) where a subsequently deposited cobalt silicide layer tends to bridge over the top of the spacers. In this SEM, the electrical contacts to the collector, base and emitter regions are also clearly shown.

It is an object of the present invention to provide an improved process for fabricating spacers that separate parts of the base and emitter layers (except in the desired emitter window), to reduce the risk of silicide bridging while not increasing the width of the spacer at the bottom adjacent to the base-emitter window 9.

It is a further object of the invention to provide improved devices incorporating such spacers.

According to one aspect, the present invention provides method of forming a bipolar transistor, comprising the steps of:

forming a collector region in a substrate;
forming a base including a base stack region, and an emitter region, over the substrate;
laterally separating the base stack region and the emitter region from one another by forming an electrically insulating spacer therebetween,
the insulating spacer having a width dimension at its top end at least as large as the width dimension at its bottom end.

The step of forming a base of the transistor may include: forming a first base layer on the substrate; forming a planarization layer on the first base layer; defining a base window through the planarization layer and the first base layer to expose the collector region, including etching the planarization layer to a greater lateral extent than the first base layer on which it is formed; depositing a base epitaxial layer on the exposed collector region and a base stack on sidewalls of the base window; the method further including the steps of: forming the spacer by forming an electrically insulating layer in the base window and etching the insulating layer so as to leave a residual portion thereof that covers the portion of the base stack that forms the sidewalls of the base window, wherein the greater lateral extent of the etch of the planarization layer results in a widening of the spacer or a sloping outward of the spacer at least part way up the spacer.

The emitter region may be formed in the base window by depositing a semiconductor material over the first base layer and the spacer. Planarizing the structure may be by removing all layers down to a depth part way through the planarization layer. Planarizing the structure may comprise removing all layers down to a depth corresponding to a widest part of the spacer. A silicide layer may be formed on the base stack and the emitter region on either side of the spacer, the silicide layer being discontinuous over the top surface of the spacer. The base of the transistor may be formed by forming a cap layer on the planarization layer and defining the base window through said cap layer as well as said planarization layer and said base silicon layer, wherein the etching of the planarization layer is performed to a greater lateral extent than the etching of the cap layer so as to undercut the cap layer and form a recessed portion of the base window sidewall prior to forming the base stack thereon. The spacer may be formed by forming the electrically insulating layer as a three layer structure comprising a first silicon oxide layer, a silicon nitride layer and a second silicon oxide layer and wherein the etching of said layers to leave said residual portion comprises etching the second silicon layer to end point on the nitride layer, then removing the exposed nitride layer. The spacer may be formed so as to have one of a gamma-shaped or inverted L-shaped structure, or an oblique shape.

According to another aspect, the present invention provides a bipolar transistor structure having a collector formed in a substrate and a base and an emitter formed over the substrate, the base having a base stack region being laterally separated from the emitter on the substrate by an electrically insulating spacer, in which the insulating spacer has a width dimension at its top end at least as large as the width dimension at its bottom end.

The spacer may have a width dimension at its top end larger than the width dimension at its bottom end. The spacer may be formed as a Γ-shaped or inverted L-shaped structure. The spacer may be formed as an oblique spacer in which the spacer has a generally uniform width or a width which increases slightly towards the top of the spacer, and where the top surface that has a width substantially the same as, or greater than, the width of the bottom surface, is displaced laterally outwardly from the bottom surface. The oblique spacer may have a curved profile, such that it presents a convex surface to the emitter and a concave surface to the base stack region. The spacer may be formed from a silicon oxide or from a silicon oxide and silicon nitride layered structure.

Embodiments of the present invention will now be described by way of example and with reference to the accompanying drawings in which.

The inventors have recognised that it would be advantageous to provide a spacer which separates parts of the base and emitter of the transistor in which the spacer is at least as wide at the top of the spacer as it is at the base of the spacer. More preferably, it would be advantageous to provide such a spacer which is wider at the top of the spacer than it is at the bottom of the spacer. A number of process techniques for the formation of such a spacer are now described.

Throughout this specification, including the description, drawings, claims and abstract, the expressions "collector", "base" and "emitter" (or "collector region", "base region" and "emitter region") are used for convenience to respectively define (i) a first region in the semiconductor substrate that provides a first dopant level and dopant type, (ii) a second region of semiconductor disposed on the substrate and having a second dopant level and second dopant type to form a junction with the first region, and (iii) a third region of semiconductor disposed on the second region and having a third dopant level and third dopant type. The first and third dopant types could be the same. The first, second and third dopant types could be n, p, n respectively, or p, n, p respectively. It will be understood that the devices described here could be inverted so that an emitter region is formed in the substrate and a collector region formed over the substrate. The labels are to be construed accordingly.

Inverted-L or "Γ-Shaped" Spacer—Process 1

A first process for creating a Γ-shaped (gamma-shaped) spacer is described with reference to FIGS. 6 to 11. The process is shown with schematic cross-sections. In each of the figures an L-shaped spacer process as discussed in connection with FIG. 4 is illustrated on the left hand side of the respective figure and the modified process for producing a gamma-shaped spacer is illustrated on the right hand side of the figure, for easy comparison.

Figure 6:
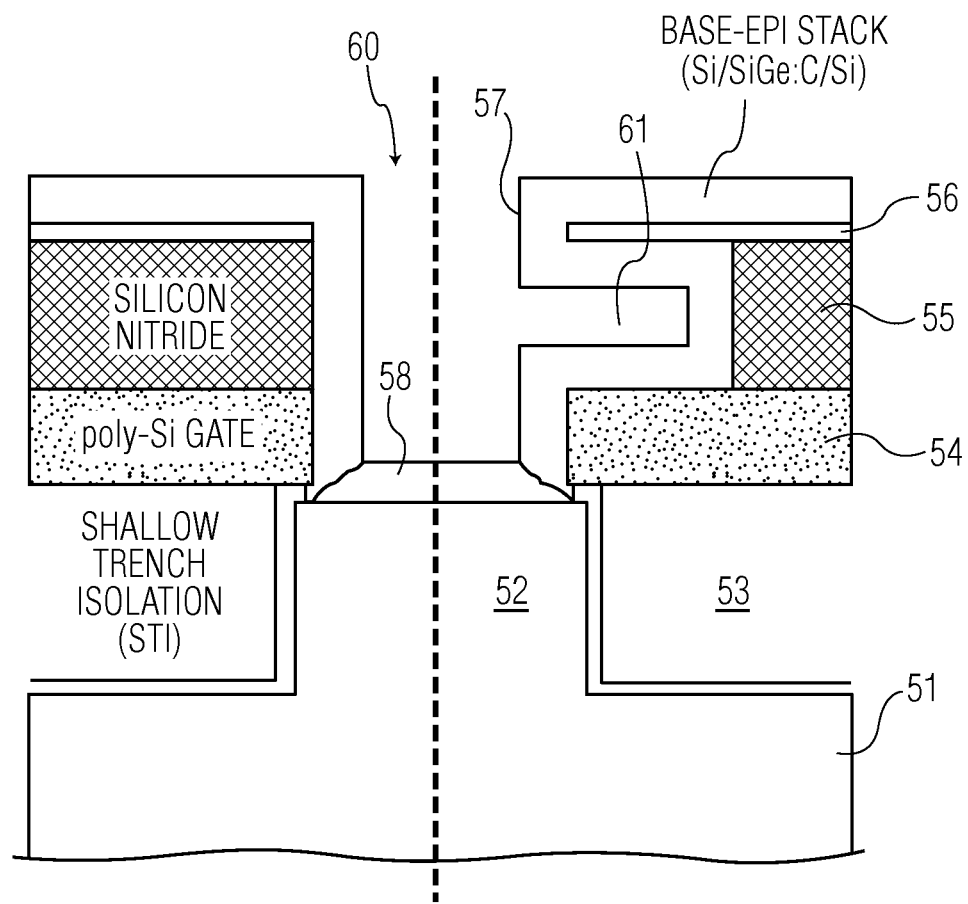
FIGS. 6 to 11 are schematic cross-sectional diagrams of a portion of an HBT fabricated with Γ-shaped (gamma-shaped) spacers (on the right hand side of the drawings) showing various stages in the fabrication sequence and compared with a corresponding L-shaped spacer (on the left hand side of the drawings)

Within substrate 51 is formed a collector region 52 and shallow trench isolation regions 53 in conventional manner. A polysilicon gate layer 54 is deposited onto the substrate, followed by a silicon nitride planarization (CMP stopping) layer 55 and a polysilicon cap layer 56. A photolithography stage follows to define a base window opening in photoresist (not shown) over the polysilicon cap layer 56. The base window 60 is then formed by etching through the polysilicon cap layer 56, the nitride layer 55 and the polysilicon gate layer 54. This is preferably performed using a single anisotropic etch, e.g. dry etch process. This dry etch is followed by a separate lateral etch of the nitride, layer 55 to undercut the polysilicon cap layer to provide a somewhat re-entrant or recessed profile of the walls of the base window 60, as shown in FIG. 6. This nitride etch is preferably a wet etch process, e.g. using $H_3PO_4$. Note that the recess 61 in the nitride layer 55 is shown greatly exaggerated for clarity, as will become apparent later. Note also that the polysilicon cap layer 56 does not form part of an L-shaped spacer production process on the left hand side of the figure. The photoresist layer may be removed after the first (dry) etch process, or after the second (wet) etch process. Other etch strategies may be possible to obtain the required profile of base window, for example by a separate first etch through the polysilicon cap layer 56 followed by a second etch through the nitride layer 55 and a third etch through the polysilicon gate layer 54.

A base stack 57 and epitaxial base layer 58 of Si/SiGe:C/Si is then formed over the etched base window profile resulting in the structure shown in FIG. 6.

Figure 2:
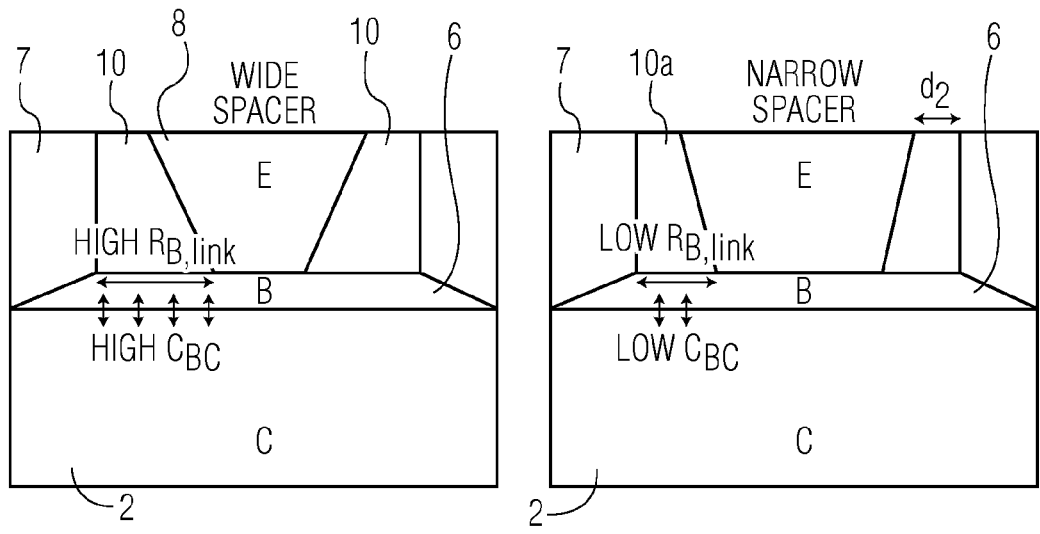
FIG. 2 is a schematic cross-sectional diagram of wide and narrow spacers used in HBT fabrication illustrating the effects of the spacer dimensions on transistor characteristics.
Figure 3A:
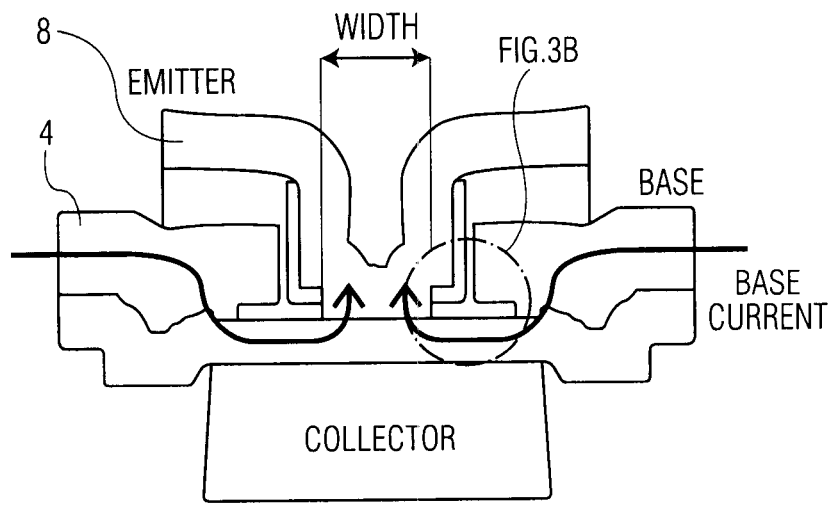
FIG. 3A is a schematic cross-sectional diagram of a portion of an HBT fabricated using a BiCMOS process.
Figure 3B:
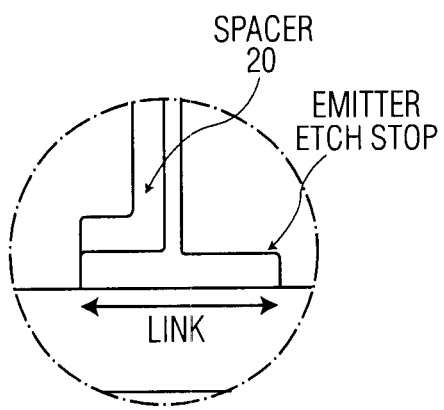
FIG. 3B is a close-up view of a portion the cross-sectional diagram of the HBT of FIG. 3A.
Figure 3C:
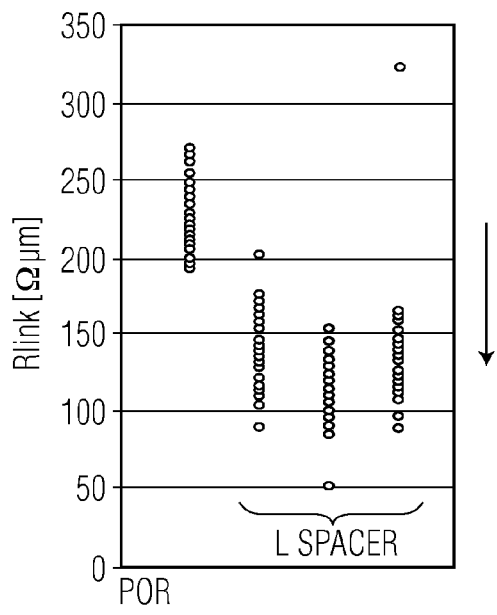
FIG. 3C is plot of Link Resistance as a function of L-spacer distance.
Figure 3D:
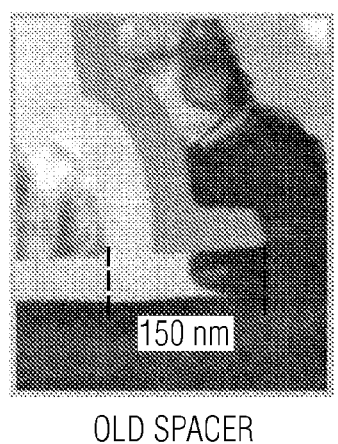
FIG. 3D is a scanning electron micrograph (SEM) of an example spacer structure.
Figure 3E:
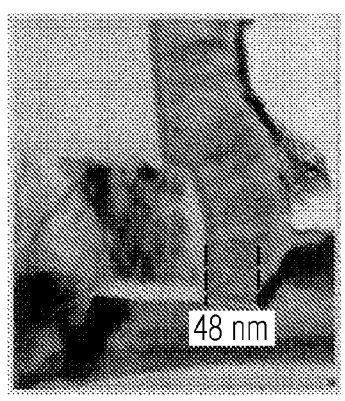
FIG. 3E is a scanning electron micrograph (SEM) of a new Leuven spacer.
Figure 4A:
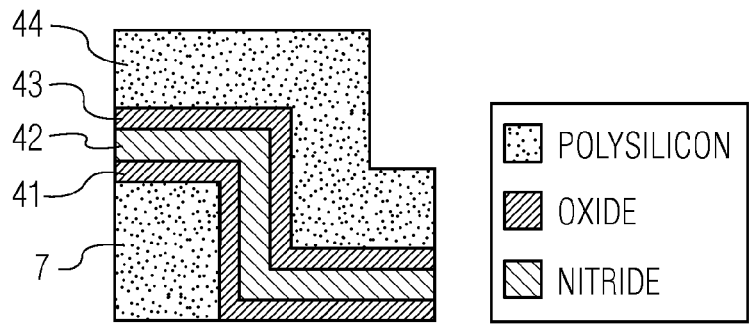
FIGS. 4A-4D are cross-sectional diagrams of four stages of the fabrication of an L-shaped spacer used within the HBT of FIG. 3.
Figure 4B:
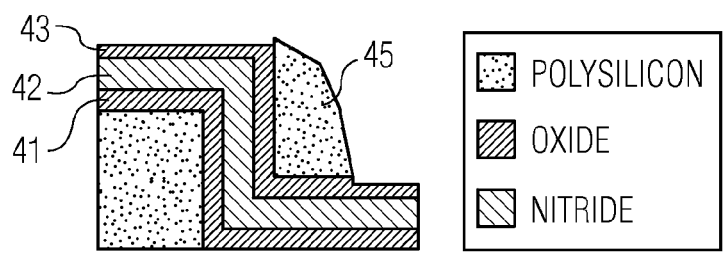
Figure 4C:
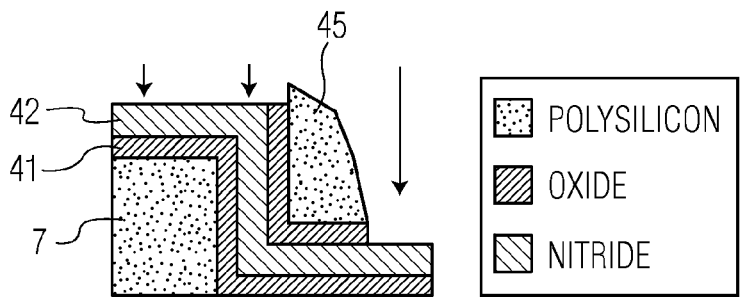
Figure 4D:
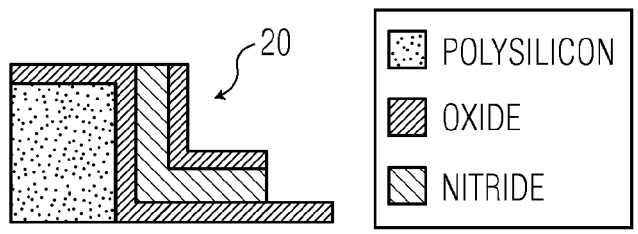
Figure 5:
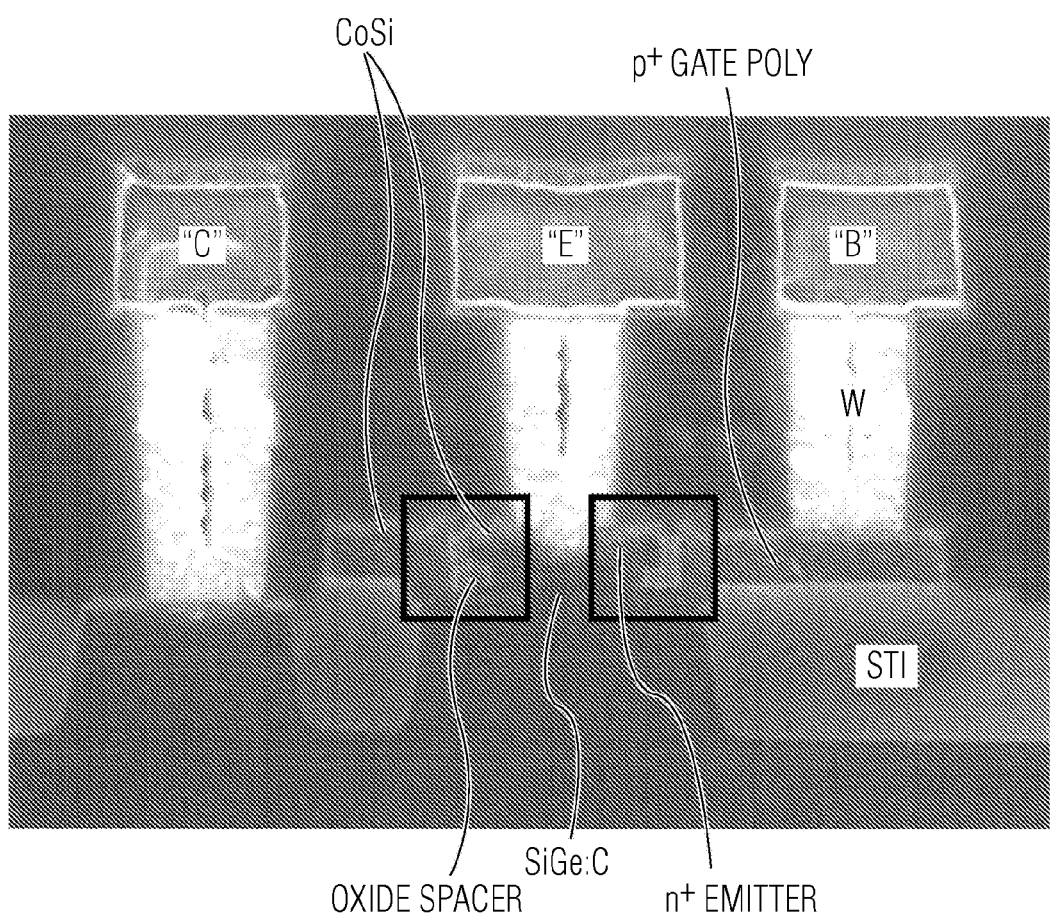
FIG. 5 is a scanning electron micrograph (SEM) of an HBT fabricated using L-shaped spacers.
Figure 7:
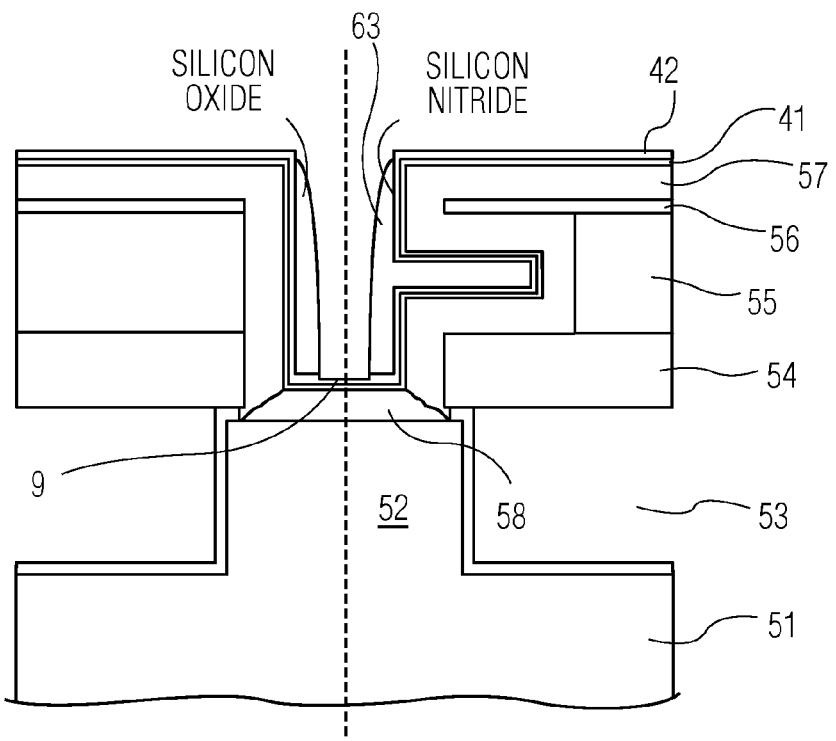

Turning now to FIG. 7, a spacer 63 is formed by deposition of a suitable spacer material which fills the base window 60 and is then etched back using a process similar to that shown in FIG. 2. In one arrangement, similar to FIG. 2, the spacer formation process first forms a first thin layer of silicon oxide 41, followed by a layer of silicon nitride 42, followed by a second thin layer of silicon oxide 43 followed by a polysilicon spacer material which is then processed similar to that described for FIG. 2. In a preferred process as shown in FIG. 7, the spacer formation process first forms a first thin layer of silicon oxide 41, followed by a layer of silicon nitride 42, followed by a second much thicker layer of silicon oxide 43. A dielectric layer is preferred for the spacers, e.g. silicon oxide or silicon nitride. The layer of silicon oxide could be formed using a known TEOS deposition process. An anisotropic etch of the second oxide layer 43 to an endpoint of exposure of the nitride layer 42 leaves a wedge-shaped oxide spacer 63 as shown in FIG. 7.

The spacer could be formed using various processes, including use of only oxide layers, using the oxide and nitride layers as shown, or using a polysilicon-based spacer as shown in FIG. 2. The use of an oxide-nitride-oxide sandwich is preferred as it allows for triggering an etch endpoint on exposure of the nitride layer. More generally, the spacer may be formed from any suitable electrically insulating material such as a dielectric material or combination of insulating layers which facilitate generally conformal coverage of the recessed or stepped base window profile and a subsequent etch that stops on the epitaxial base layer 58 in the emitter window 9 while leaving some coverage on the sidewalls of the base stack.

The width of the lower part of the spacer is a function of the deposited thickness of the oxide (or other spacer material), the height of the step (sum of deposited polysilicon gate layer 54+silicon nitride CMP stopping layer 55+polysilicon cap layer 56) and the total etch time.

Following the oxide spacer etch, the uncovered thin nitride layer 42 is removed using a suitable wet etch, with the remaining second oxide layer 43 acting as a hard mask. The remaining exposed first thin oxide layer 41 on the base stack layer 57 and epitaxial base layer 58 is removed and then a polysilicon emitter layer 59 is deposited, resulting in the structure shown in FIG. 8.

Figure 8:
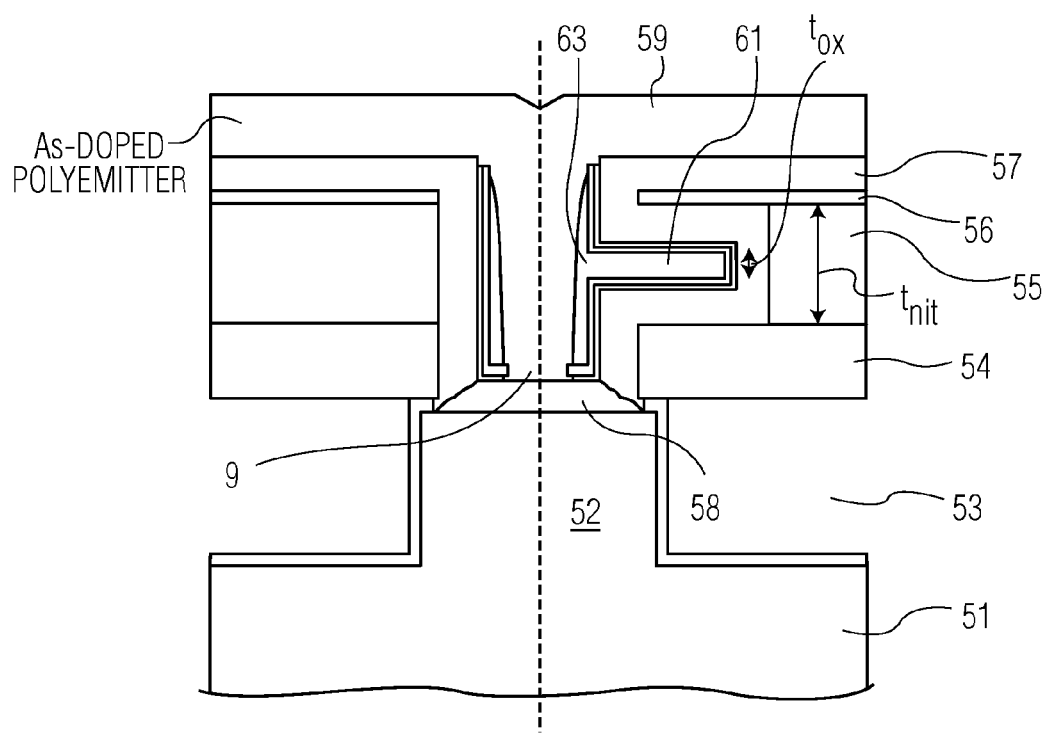
Figure 9:
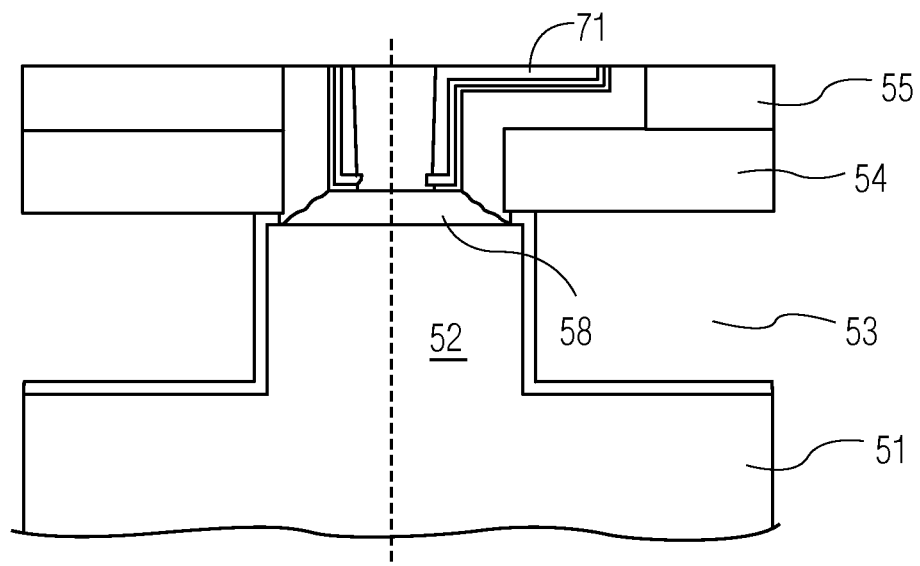

A planarization process follows that aims to stop halfway through the nitride planarization layer 55, as shown in FIG. 9. In the planarization process, all layers are removed in a planar fashion, e.g. using a chemical and/or mechanical removal process as known in the art, down to a level part way through the planarization layer 55. The nitride planarization layer 55 thickness ($t_{nit}$) can be tuned to meet the planarization within-wafer-uniformity requirements: a thicker nitride layer 55 creates a larger thickness of oxide ($t_{ox}$) in the recessed portion 61 of the spacer, as shown in FIG. 8. The thicker the nitride planarization layer 55, the greater is the process window available for the planarization. A typical value for the within-wafer-uniformity is 30-50 nm. Preferably, the planarization process stops approximately at a midpoint of the planarization layer. More preferably, the planarization process stops approximately at the widest part of the spacer 63. The resulting structure is shown in FIG. 9 where a Γ-shaped spacer can clearly be seen.

Figure 10:
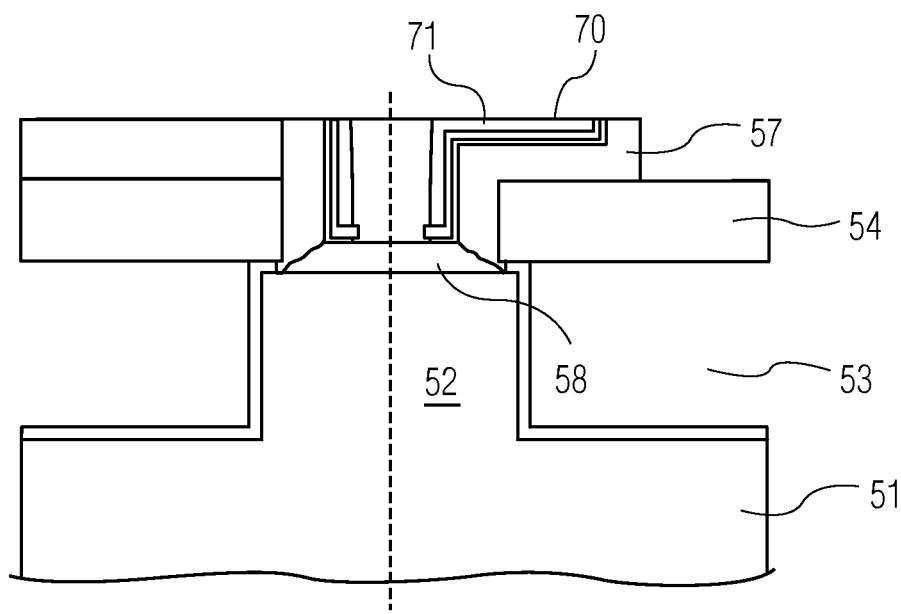
Figure 11:
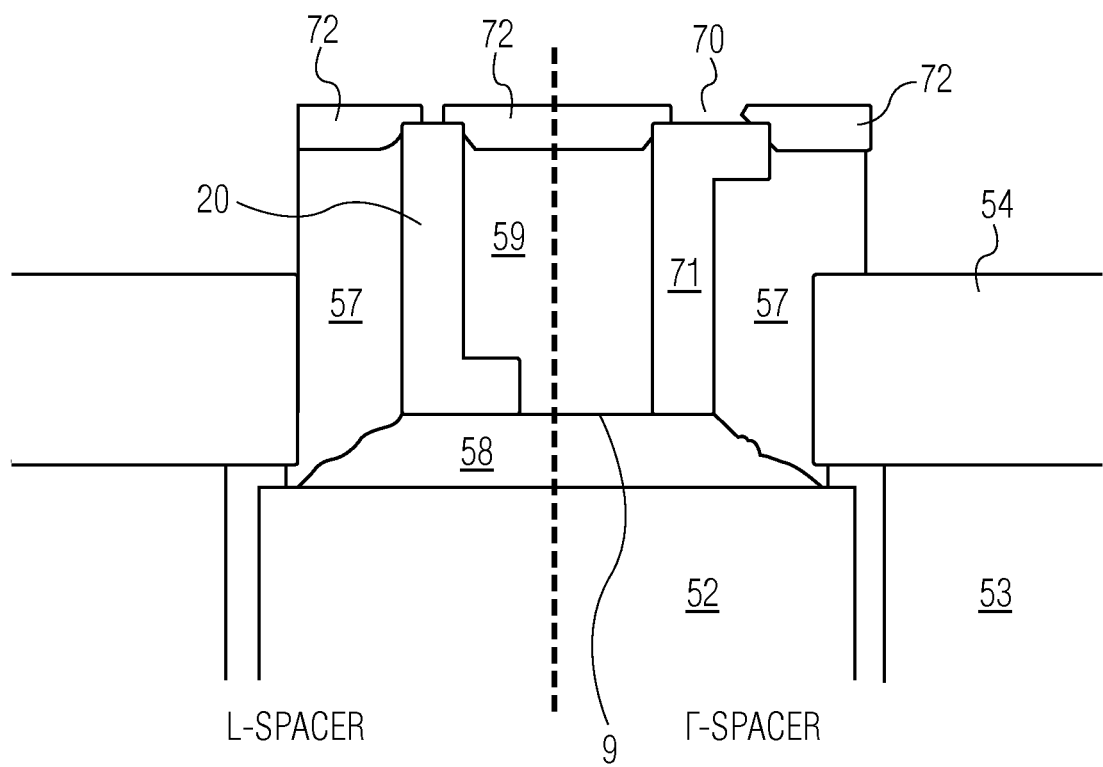

After planarization, the remaining nitride planarization CMP stopping layer 55 is removed, e.g. with a wet etch of phosphoric acid, $H_3PO_4$. The resulting cross-section is shown in FIG. 10. As mentioned earlier, the diagrams have been shown exaggerated so that the top portion 70 of the resulting gamma-shaped spacer 71 is much wider than in reality. A more proportionately drawn gamma-shaped spacer 71 is shown in FIG. 11, compared with an L-shaped spacer 20. FIG. 11 also shows a subsequent silicide layer 72 formed on the top of the polysilicon emitter layer 59 and the epitaxial base stack layer 57. The larger width of the top 70 of the gamma-shaped spacer 71 offers a substantially improved process margin to avoid silicide 72 bridging than does the L-shaped spacer 20, and also considerably reduces the width of the spacer at the bottom in contact with the epitaxial base layer 58. This results in a larger emitter window 9 width $W_E$, with consequent improvement in base link resistance and base-collector capacitance, as explained earlier.

The thin polycrystalline or amorphous silicon cap layer 56 that is used to enable a lateral etch of the silicon nitride layer 55 and thereby form a recess as shown in FIG. 6 can have a further benefit in reducing defect formation during epitaxial deposition of the epitaxial base layer 58 and base stack 57.

The width of the spacer 71 at the top may be considered as the width of the spacer after planarization, i.e. the width of the top of the spacer as shown in FIG. 9 and therefore the width of the spacer in the plane on which the silicidation process is subsequently carried out. The width of the spacer at the bottom may be considered as the width of the spacer where it abuts the epitaxial base layer 58, i.e. the portion adjacent to the plane of the emitter/base interface or emitter window.

Inverted-L or "Γ-Shaped" Spacer—Process 2

This process is similar to process 1 described above, but does not require a thin polycrystalline or amorphous silicon cap layer 56 on top of the silicon nitride layer 55.

Figure 12:
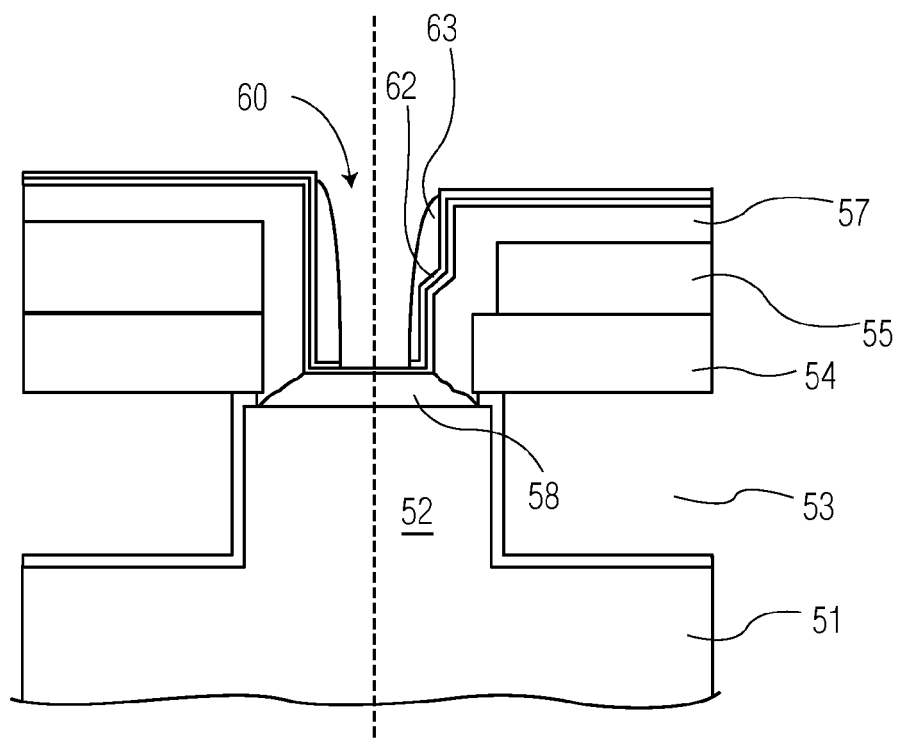
FIGS. 12 and 13 are schematic cross-sectional diagrams of a portion of an HBT fabricated with Γ-shaped spacers using a different process than shown in FIGS. 6 to 11.

In this process, after the formation of the base window 60 by etching through the nitride layer 55 and the polysilicon gate layer 54 and removal of any photolithography resist, the nitride layer 55 is etched briefly using an isotropic (e.g. wet) etch to cause lateral etching of the nitride window so that the nitride window is effectively larger than the underlying polysilicon gate layer window, as evident in FIG. 12. It will be understood that this isotropic nitride etch will also slightly reduce the thickness of the nitride layer as shown since the top is not protected by a polysilicon cap layer. However, this can be factored into the thickness of nitride layer 55 initially deposited.

FIG. 12 shows the structure after deposition of the first thin oxide layer 41, the thin nitride layer 42 and the oxide spacer layer 43 and after the anisotropic etch of the oxide spacer layer 43 to leave the oxide spacer 63. This is analogous to FIG. 7. However, in this case, the spacer does not fill a recess 61 as shown in FIG. 7, but rather occupies a ledge 62 near the height of the base of the nitride layer 55.

Figure 13:
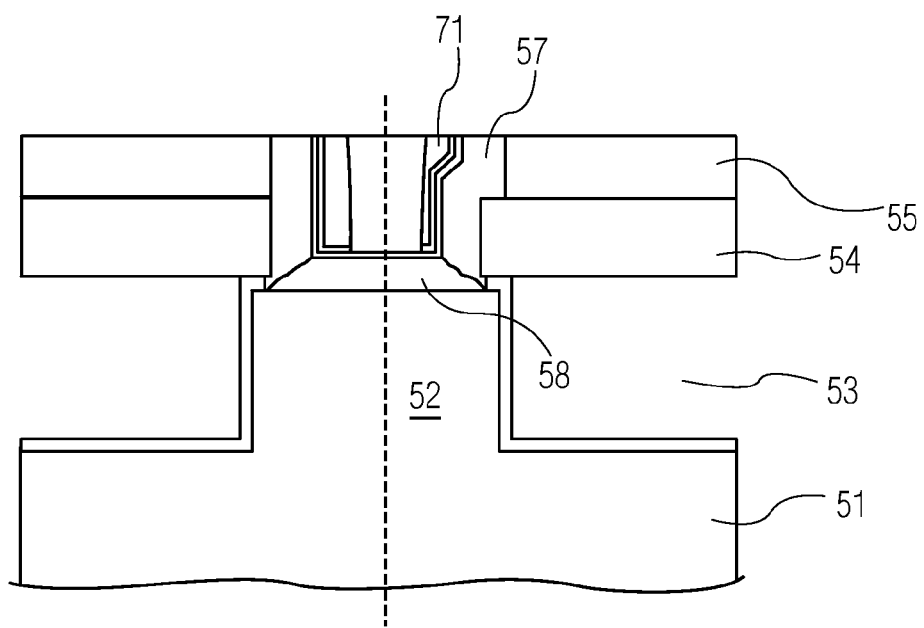

Following planarization down to approximately mid-way through the nitride layer 55, the structure is as shown in FIG. 13, analogous to FIG. 9. In similar manner to that shown and described with reference to FIGS. 10 and 11, the remainder of the nitride planarization layer 55 is removed. The spacer width is still determined by the oxide spacer etch, and the extra margin created at the top by the ledge 62 again does not increase the width of the spacer 61 at the bottom.

Similar to that described for process 1, the width of the spacer at the top may be considered as the width of the spacer after planarization, i.e. the width of the top of the spacer as shown in FIG. 13 and therefore the width in the plane on which the silicidation process is subsequently carried out.

The width of the spacer at the bottom may be considered as the width of the spacer where it abuts the epitaxial base layer 58.

Base Resistance

Figure 14:
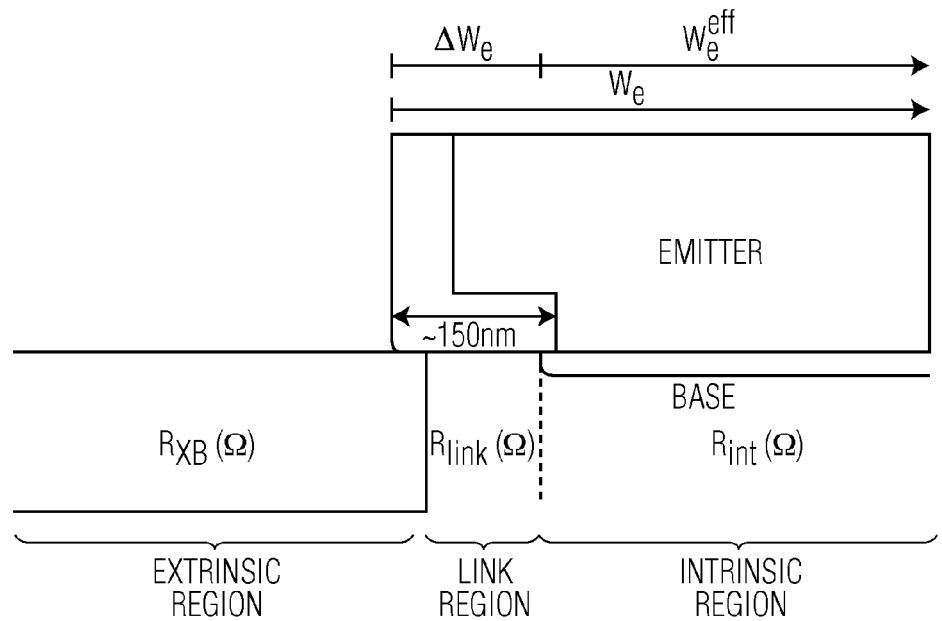
FIG. 14 is a cross-sectional schematic diagram illustrating properties of an HBT affected by L-shaped spacers.

Using the gamma-shaped spacers 71 described herein leads to a lower total base resistance by means of a reduction of the base link resistance part. FIG. 14 shows a schematic diagram of the emitter-base region indicating the extrinsic region base resistance ($R_{XB}$), the link region base resistance ($R_{link}$) and the intrinsic region base resistance ($R_{int}$) part of the base resistance for an L-shaped spacer.

The total base resistance can be written (for standard double base contact devices) as $R_B = R_{XB} + R_{link} + R_{int}$ with $$R_{int} = \frac{1}{12} \frac{W_e^{eff}}{L_e^{eff}} R_{pinch} \text{ and } R_{link} = \frac{W_{spacer}}{2 L_e^{eff}} R_{pinch},$$

where $R_{pinch}$, the base pinch resistance, is given in $\Omega_\square$ (depending on the base dope and base layer thickness). As an example, we take $R_{pinch} = 2.5 \text{ k}\Omega_\square$, $R_{XB} = 15 \Omega$ and $W_e^{eff}/L_e^{eff} = 0.5/20$ (i.e. experimentally observed values) to estimate the total base resistance and demonstrate the different contributions of the total base resistance.

|  | $W_{spacer}$ | |
| --- | --- | --- |
|  | L-spacer (~150 nm) | gamma-shaped spacer (~50 nm) |
| $R_{int}$ | 5.2 Ω | 5.2 Ω |
| $R_{XB}$ | 15 Ω | 15 Ω |
| $R_{link}$ | 9.4 Ω | 3.1 Ω |

Figure 15:
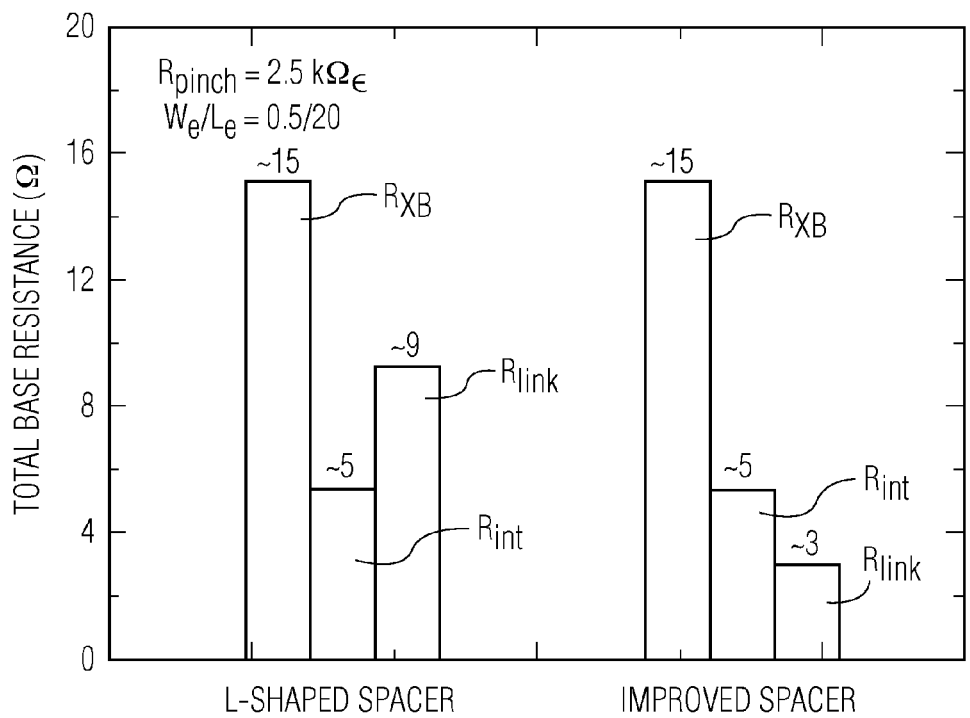
FIG. 15 is a graph showing a comparison of the total base resistance for L-shaped and Γ-shaped spacers.

FIG. 15 shows an estimate of the contribution to the total base resistance of the link under the spacer compared for the L-shaped spacer and the Γ-shaped spacer.

From FIG. 15 it is clear that a optimized Γ-shaped spacer has a clear advantage in terms of the contribution of $R_{link}$ to the total base resistance. While for the L-shaped spacer, the link resistance is about 30% of the total base resistance, the contribution for the improved spacer is less than 15%.

Figure 16:
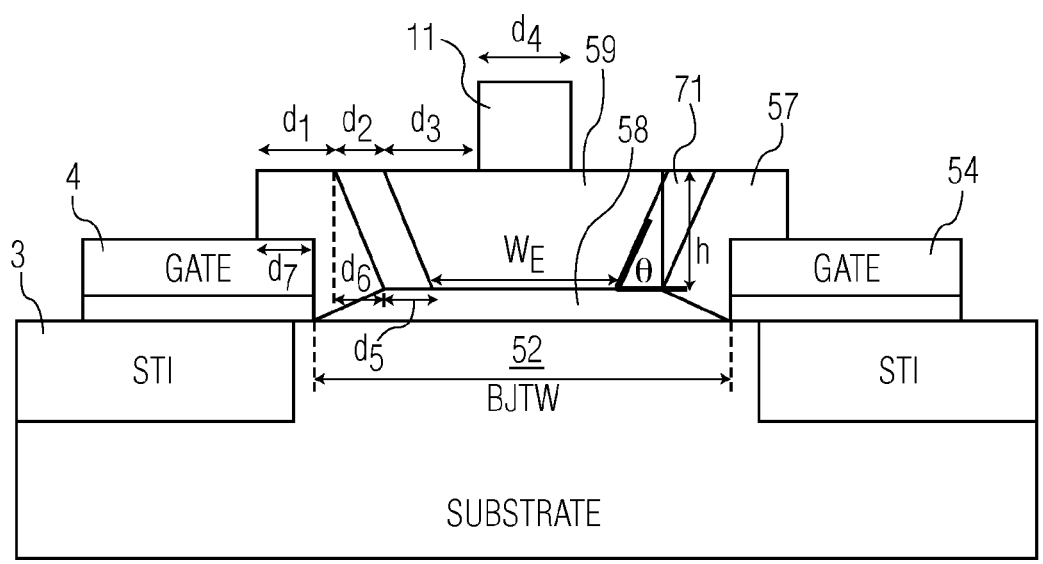
FIG. 16 is a schematic cross-sectional diagram of a portion of a generally oblique-shaped spacer.

The general geometrical properties of Γ-shaped spacers are shown schematically in FIG. 16, where $d_1$ is the width of the Si/SiGe:C/Si base stack 57; $d_2$ is the spacer width at the top of the spacer after planarization; $d_3$ is the distance between the spacer and the emitter contact 11; $d_4$ is the emitter contact width; $d_7$ is the width of the Si/SiGe:C/Si base stack 57 over the polysilicon gate layer 4; h is the spacer height; and θ is the angle of the spacer. Depending on the precise nature of the control over the downward and lateral etching of the base window through the nitride layer 55 and the gate layer 54, and the consequent rounding of corners of the layers being etched, the spacer profile may in practice move towards spacers having a generally outwardly sloping or "oblique" profile with a possible degree of outward curvature such that the spacer presents a convex surface to the emitter layer 59 and a concave surface to the gate stack 57. The expression "oblique" profile is intended to encompass a spacer that has a generally uniform width or a width which increases slightly towards the top of the spacer, and where the top surface that has a width substantially the same as, or greater than, the width of the bottom surface, is displaced laterally outwardly from the bottom surface.

Figure 1:
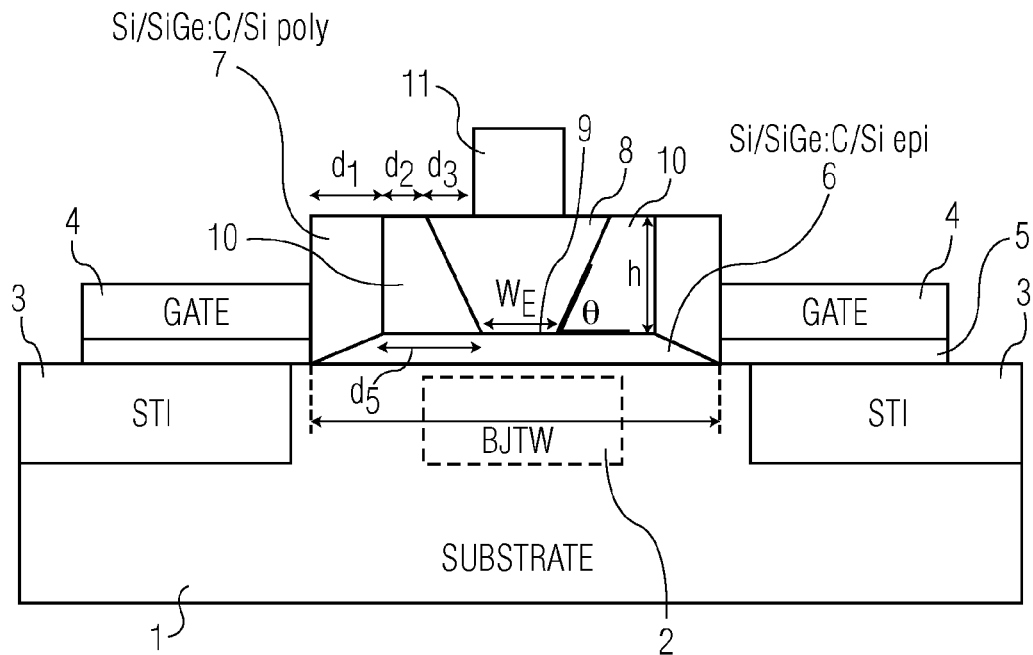
FIG. 1 (Prior Art) is a schematic cross-sectional diagram of a portion of a planar heterojunction bipolar transistor (HBT) having spacers that are broader at the bottom than at the top.
Figure 17:
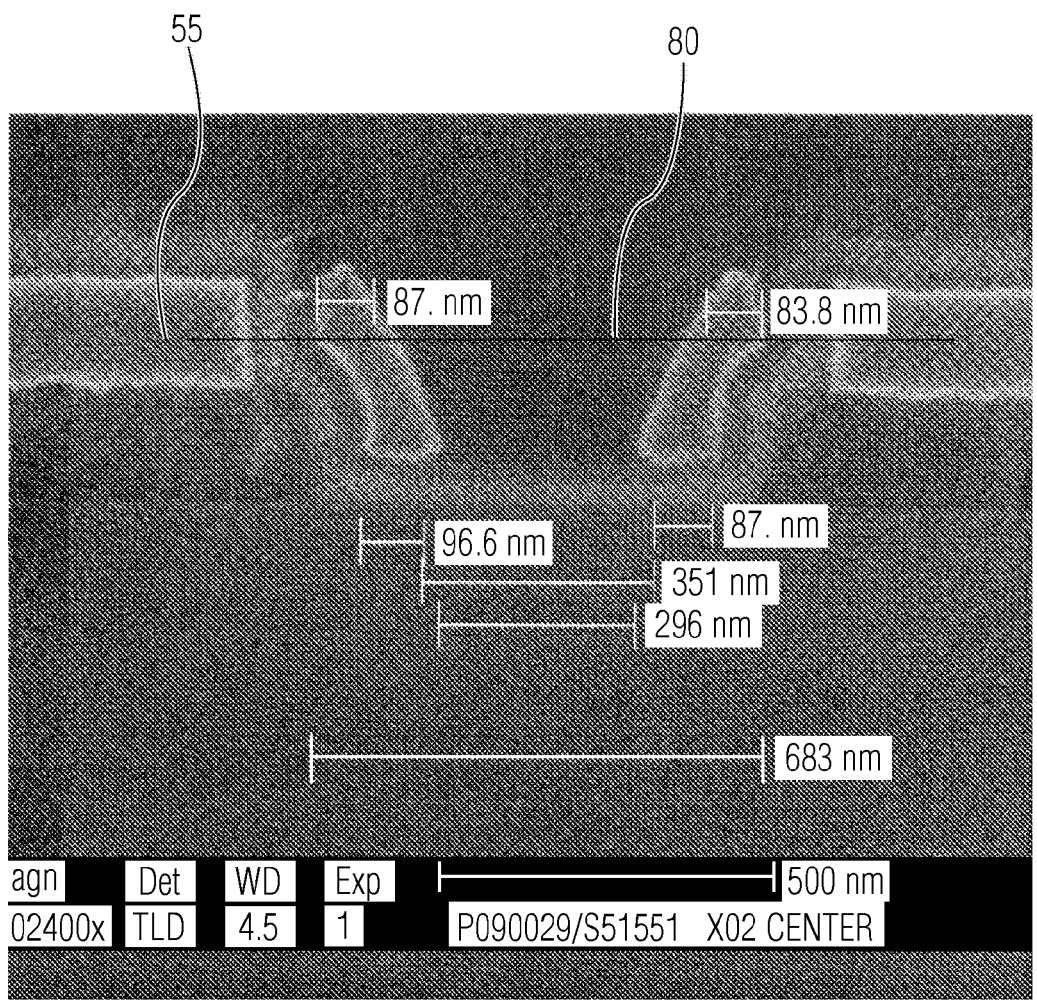
FIG. 17 is a scanning electron micrograph of a gamma-shaped spacer formed using the processes described above.

An example of such an oblique arrangement of spacer with a slightly outwardly curved profile is shown in a SEM in FIG. 17, before planarization. The intended planarization level is indicated by horizontal line 80 approximately bisecting the nitride planarization layer 55. As can be seen, the width of the bottom of the spacers is of the order of 90 nm and the width of the spacers at the level of the planarization line 80 is at least as large as this. Specifically, by comparison with the scale markings of 87 and 83.8 nm at the top of the unplanarized spacers, the spacer width at the planarization line 80 is approximately 120 nm. The emitter window width is approximately 300 nm. It has been found that a top width of the spacer of at least about 50 nm is desirable to avoid silicide bridging between the emitter and the base. Using spacers of the form of FIG. 1, a width of 50 nm at the top of the spacer is typically achieved with a width at the bottom of the spacer of 150 nm. A reduction of spacer width from 150 nm down to 50 nm at the bottom of the spacer reduces total base resistance by about 10 to 15%.

Figure 18A:
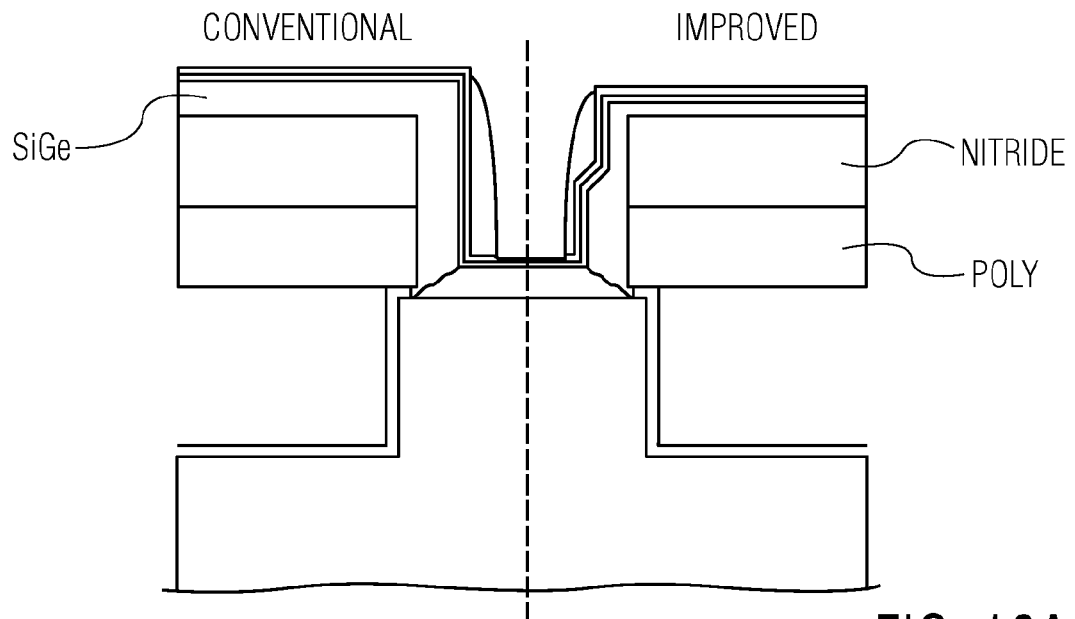
FIG. 18A is a schematic cross-sectional diagram of an example conventional and improved spacer.
Figure 18B:
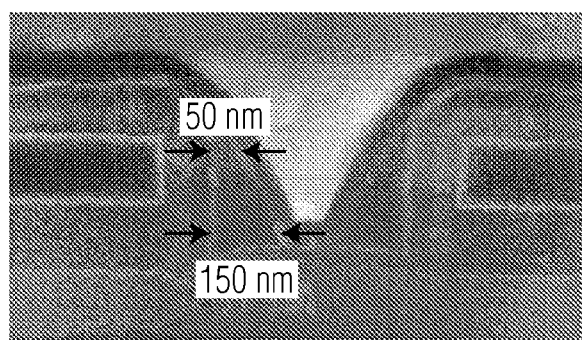
FIG. 18B is a SEM of the example conventional spacer.
Figure 18C:
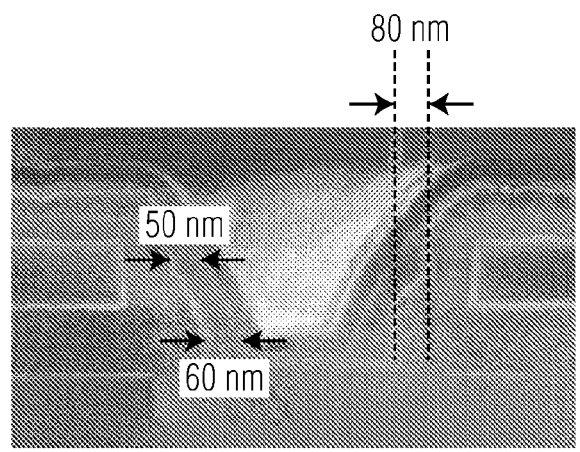
FIG. 18C is a SEM of the example improved spacer.

FIG. 18 shows a comparison of the two methods. On the left hand side, an L-shaped spacer has a bottom width of 150 nm and a top width at the planarization level of halfway through the nitride layer of just slightly more than 50 nm. On the right hand side of the figure, a gamma-shaped or oblique spacer having a top width at the same planarization level of about 60-70 nm but a base width of about 60 nm. This is achieved with a lateral nitride layer etch of 80 nm. This also adds approximately 160 nm to the top width of the emitter 8, which improves the process margin for aligning the emitter contact 11.

It can be seen from the foregoing process description that the introduction of a nitride etch (e.g. wet etch) after the base window etch but before the epitaxial growth of the base layer 58 and base stack 57 provides a control of creation of a gamma- or oblique-shaped spacer with substantial benefits to control of the emitter window dimensions and avoidance of silicide shorts at the top of the spacers. The overall width of the spacers can be tuned using a wet etch in, e.g. hydrofluoric acid.

The invention is particularly suitable to boost the performance of a low-complexity HBT that can be used in mixed signal applications.

Other embodiments are intentionally within the scope of the accompanying claims.

The invention claimed is:

1. A method of forming a bipolar transistor, the method comprising:
    forming a collector region in a substrate;
    forming a base region over the substrate, the formed base region including a base stack region;
    forming an emitter region over the substrate;
    laterally separating the base stack region and the formed emitter region from one another by forming an electrically insulating spacer having a width dimension at its top surface that is wider than a width dimension at its bottom surface; and
    forming a coplanar silicide layer on top of both the emitter region and the base stack region, wherein the electrically insulating spacer prevents the coplanar silicide layer from bridging between the emitter region and the base stack region.

2. The method of claim 1 in which the step of forming the base region of further comprises:
    forming a first base layer on the substrate;
    forming a planarization layer on the first base layer;
    defining a base window through the formed planarization layer and the formed first base layer to expose the formed collector region, including etching the formed planarization layer to a greater lateral extent than the first base layer on which it is formed;

depositing a base epitaxial layer on the exposed collector region and the base stack region on sidewalls of the base window;

forming the electrically insulating spacer by forming an electrically insulating layer in the defined base window and etching the formed electrically insulating layer so as to leave a residual portion thereof that covers a portion of the base stack region that forms sidewalls of the base window, wherein a greater lateral extent of the etch of the planarization layer results in a sloping outward of the formed electrically insulating spacer at least part way up the formed electrically insulating spacer.

3. The method of claim 2, further comprising:

forming the emitter region in the defined base window by depositing a semiconductor material over the formed first base layer and the formed electrically insulating spacer.

4. The method of claim 3, further comprising:

planarizing by removing all layers down to a depth part way through the formed planarization layer.

5. The method of claim 4, in which the step of planarizing further comprises:

removing all layers down to a depth corresponding to a widest part of the formed electrically insulating spacer.

6. The method of claim 1, wherein the width dimension at the top surface is a width of the electrically insulating spacer in a plane of which a silicidation process is carried out.

7. The method of claim 2, in which the step of forming the base region further comprises:

forming a cap layer on the formed planarization layer; and defining the base window through said formed cap layer, said formed planarization layer, and said formed first base layer, wherein the etching of the formed planarization layer is performed to a greater lateral extent than the etching of the formed cap layer so as to undercut the formed cap layer and form a recessed portion of a base window sidewall prior to forming the base stack region thereon.

8. The method of claim 2, wherein the step of forming the electrically insulating spacer further comprises:

forming said electrically insulating layer as a three layer structure comprising a first silicon oxide layer, a silicon nitride layer, and a second silicon oxide layer, and wherein the etching of said layers to leave said residual portion comprises etching the second silicon layer to an end point on the silicon nitride layer, and then removing the exposed silicon nitride layer.

9. The method of claim 1, wherein the spacer is formed in an uppercase gamma (Γ) shape.

10. The method of claim 9, wherein link resistance is less than 15% of total base resistance for the spacer formed in the uppercase gamma (Γ) shape.

11. The method of claim 1, wherein the top surface of the electrically insulating spacer is substantially flat.

12. The method of claim 1, wherein the width dimension at the bottom surface is a width of the electrically insulating spacer where the electrically insulating spacer abuts an epitaxial base layer.

13. The method of claim 11, wherein an angle of the electrically insulating spacer has a degree of curvature to present a convex surface to an emitter layer and a concave surface to a gate stack.

14. A bipolar transistor structure comprising:
a substrate;
a base; and
an emitter formed over the substrate, wherein the base has a base stack region laterally separated from the emitter on the substrate by an electrically insulating spacer, the electrically insulating spacer has a width dimension at its top surface that is wider than a width dimension at its bottom surface, a coplanar silicide layer is formed on top of both the emitter region and the base stack region, and the electrically insulating spacer prevents the coplanar silicide layer from bridging between the emitter region and the base stack region.

15. The transistor structure of claim 14 in which the spacer is formed in an uppercase gamma (Γ) shape.

16. The transistor structure of claim 14 in which the electrically insulating spacer is formed as an oblique spacer in which the formed oblique spacer has a width which increases slightly toward the top of the formed oblique spacer, and where the top surface is displaced laterally outwardly from the bottom surface.

17. The transistor structure of claim 16, in which the formed oblique spacer has a curved profile, such that it presents a convex surface to the emitter and a concave surface to the base stack region.

18. The transistor structure of claim 14, in which the spacer is formed from a silicon oxide and silicon nitride layered structure.

* * * * *